United States Patent
Du et al.

(10) Patent No.: US 11,784,135 B2
(45) Date of Patent: Oct. 10, 2023

(54) SEMICONDUCTOR DEVICE INCLUDING CONDUCTIVE BUMPS TO IMPROVE EMI/RFI SHIELDING

(71) Applicant: WESTERN DIGITAL TECHNOLOGIES, INC., San Jose, CA (US)

(72) Inventors: Jiandi Du, Shanghai (CN); Binbin Zheng, Shanghai (CN); Rui Guo, Shanghai (CN); Chin-Tien Chiu, Taichung (TW); Zengyu Zhou, Shanghai (CN); Fen Yu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 24 days.

(21) Appl. No.: 17/354,119

(22) Filed: Jun. 22, 2021

(65) Prior Publication Data
US 2022/0406726 A1    Dec. 22, 2022

(51) Int. Cl.
*H01L 23/552*    (2006.01)
*H01L 25/065*    (2023.01)
*H01L 25/18*    (2023.01)
*H01L 23/00*    (2006.01)
*H01L 23/498*   (2006.01)
*H01L 25/00*    (2006.01)

(52) U.S. Cl.
CPC ...... *H01L 23/552* (2013.01); *H01L 23/49838* (2013.01); *H01L 24/13* (2013.01); *H01L 25/0652* (2013.01); *H01L 25/18* (2013.01); *H01L 25/50* (2013.01); *H01L 2224/1357* (2013.01); *H01L 2224/13144* (2013.01); *H01L 2224/13647* (2013.01); *H01L 2225/06506* (2013.01); *H01L 2225/06537* (2013.01); *H01L 2225/06562* (2013.01); *H01L 2225/06582* (2013.01); *H01L 2924/3025* (2013.01)

(58) Field of Classification Search
None
See application file for complete search history.

(56) References Cited

U.S. PATENT DOCUMENTS

2019/0082562 A1 *    3/2019    Mun .................. H05K 7/20445

* cited by examiner

*Primary Examiner* — Long Pham
(74) *Attorney, Agent, or Firm* — Vierra Magen Marcus LLP

(57) ABSTRACT

A semiconductor device has shielding to prevent transmission and/or reception of EMI and/or RFI radiation. The semiconductor device comprises a substrate including grounded contact pads around a periphery of the substrate, exposed at one or more edges of the substrate. A bump made of gold or other non-oxidizing conductive material may be formed on the contact pads, for example using ultrasonic welding to remove an oxidation layer between the contact pads and the conductive bumps. The conductive bumps electrically couple to a conductive coating applied around the periphery of the semiconductor device.

18 Claims, 7 Drawing Sheets

SEMICONDUCTOR DEVICE INCLUDING CONDUCTIVE BUMPS TO IMPROVE EMI/RFI SHIELDING

BACKGROUND

The strong growth in demand for portable consumer electronics is driving the need for high-capacity storage devices. Non-volatile semiconductor memory devices are becoming widely used to meet the ever-growing demands on digital information storage and exchange. Their portability, versatility and rugged design, along with their high reliability and large capacity, have made such memory devices ideal for use in a wide variety of electronic products, including for example digital cameras, digital music players, video game consoles, computer SSDs, PDAs and cellular telephones.

While many varied packaging configurations are known, flash memory semiconductor devices may in general be assembled as system-in-a-package (SIP) or multichip modules (MCM), where a plurality of semiconductor die are mounted and interconnected to an upper surface of a small footprint substrate. The substrate may in general include a rigid, dielectric base having a conductive layer etched into a pattern of pads and traces on one or both sides. Semiconductor dies are then mounted and electrically coupled to the substrate, and the dies are then encapsulated in a mold compound.

As electronic components get smaller and operate at higher frequencies, the noise and cross talk caused by electromagnetic interference (EMI) and radio frequency interference (RFI) are becoming more of a concern. Electromagnetic radiation is emitted by electrical circuits carrying rapidly changing signals as a by-product of their normal operation. Such electromagnetic radiation induces EMI and/or RFI to other circuits, which causes unwanted interference or noise.

Efforts have been made to shield the transmission and reception of EMI and/or RFI radiation at the semiconductor package level. For example, grounded copper pads have been left exposed at the edge of the package, which pads are coupled to a conductive shield layer around the package. However, an oxidation layer forms on the copper pads, which results in increased contact resistance, or CRES, between the pads and the conductive shield. Higher CRES leads to decreased EMI/RFI shielding.

DETAILED DESCRIPTION

Figure 1:
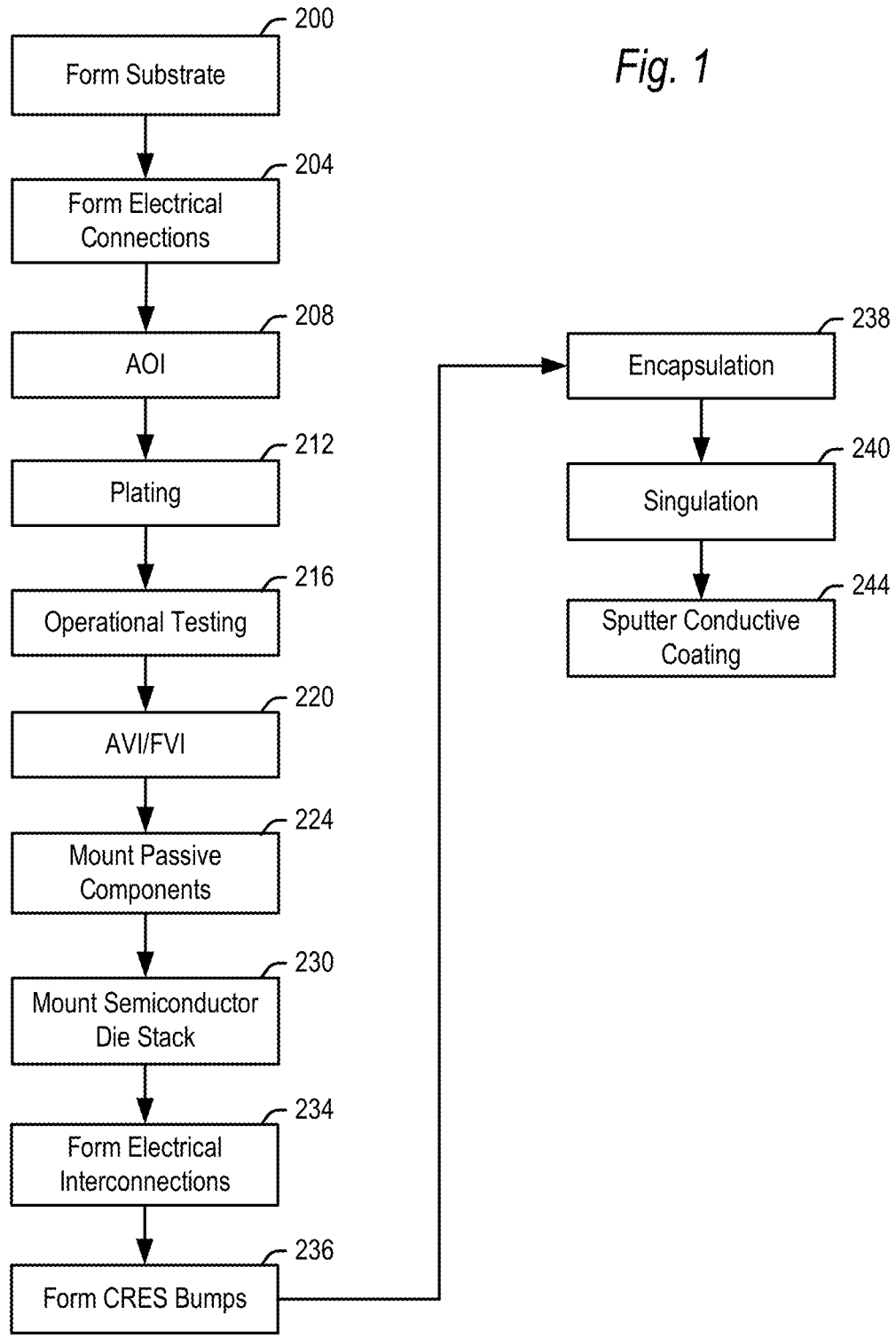
FIG. 1 is a flowchart of the overall fabrication process of a substrate and a semiconductor device using that substrate according to embodiments of the present technology.

The present technology will now be described with reference to the figures, which in embodiments, relate to a semiconductor device including shielding to prevent transmission and reception of electromagnetic and/or radio frequency radiation. The semiconductor device comprises a substrate including grounded contact pads around a periphery of the substrate, exposed at one or more edges of the substrate. A bump made of gold or other non-oxidizing conductive material may be formed on the contact pads, for example using ultrasonic welding to remove an oxidation layer between the contact pads and the conductive bumps. Upon completion of an encapsulated semiconductor device, the device may be singulated by cutting through the peripheral contact pads and conductive bumps, leaving a severed portion of the peripheral contact pads and conductive bumps exposed at one or more edges of the semiconductor device. A conductive coating may lastly be sputtered around the periphery of the semiconductor device, in contact with the severed portions of the conductive bumps, to prevent transmission and reception of EMI and/or RFI radiation.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5% of a given dimension.

For purposes of this disclosure, a connection may be a direct connection or an indirect connection (e.g., via one or more other parts). In some cases, when a first element is referred to as being connected, affixed or coupled to a second element, the first and second elements may be directly connected, affixed or coupled to each other or indirectly connected, affixed or coupled to each other. When a first element is referred to as being directly connected, affixed or coupled to a second element, then there are no intervening elements between the first and second elements (other than possibly an adhesive or melted metal used to connect, affix or couple the first and second elements).

Figure 2:
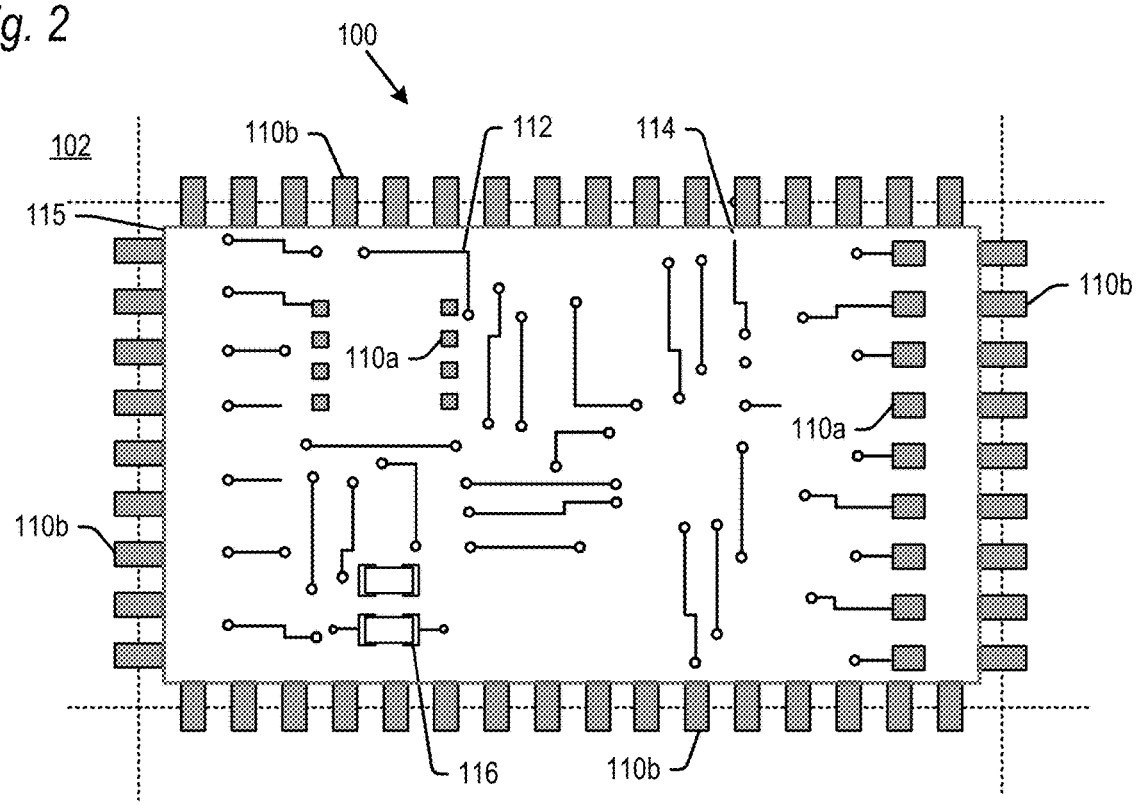
FIG. 2 is a top view of a substrate of a semiconductor device at a first step in the fabrication process according to an embodiment of the present technology.
Figure 3:
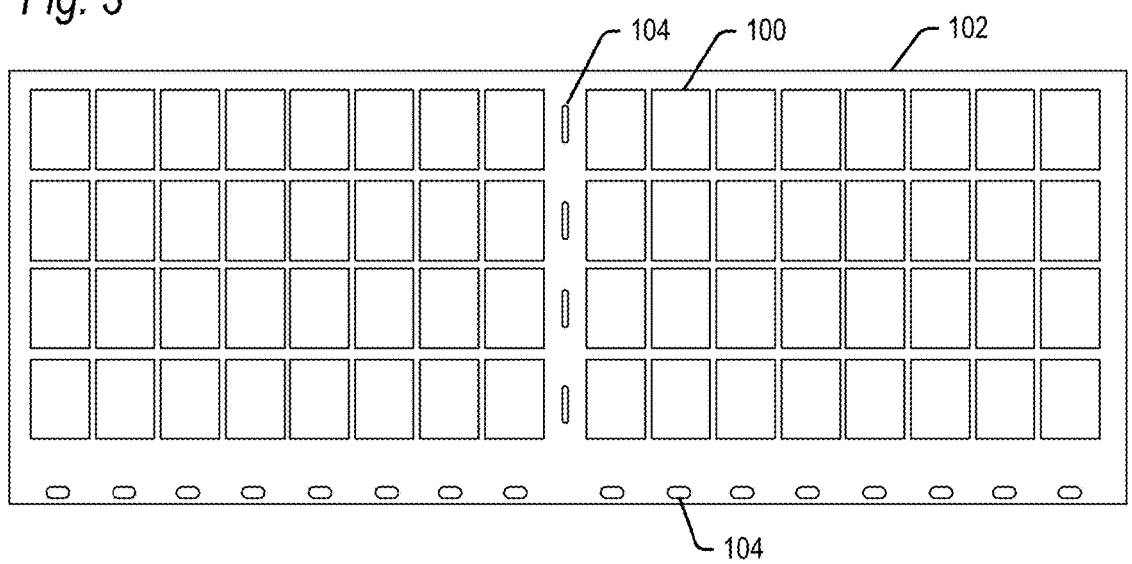
FIG. 3 is a top view of a panel of substrates according to an embodiment of the present technology.

An embodiment of the present technology will now be explained with reference to the flowchart of FIG. 1 and the top, side, edge and perspective views of FIGS. 2 through 13. The assembly of semiconductor device 150 begins with a plurality of substrates 100 formed contiguously on a panel 102 as shown in FIGS. 2 and 3. Substrate 100 is a signal-carrier medium provided for transferring electrical signals between semiconductor dies mounted on the substrate and a host device, as explained below. Substrate 100 is also provided with grounded contact pads for EMI/RFI shielding, as explained below. FIG. 3 shows one representation of a panel 102 of substrate 100, though panel 102 may have a wide variety of other configurations and numbers of substrates 100. Fiducial marks 104 are provided on the substrate panel 102 to allow machine vision alignment of a substrate panel in a processing tool. Again, the fiducial marks are by way of example only and may vary in other substrate panels.

The substrate 100 may be a variety of different chip carrier mediums, including a printed circuit board (PCB), a leadframe or a tape automated bonded (TAB) tape. Where substrate 100 is a PCB, the substrate may be formed of one or more core layers 106 sandwiched between two or more conductive layers 108 as shown in side and edge views of substrate 100 shown in FIGS. 4 and 5, respectively. The one or more core layers 106 may be formed of various dielectric materials such as for example, polyimide laminates, epoxy resins including FR4 and FR5, bismaleimide triazine (BT), and the like. The one or more core layers 106 may be ceramic or organic in alternative embodiments.

In step 200, the two or more conductive layers 108 may be etched into conductance patterns comprising electrical connectors. These electrical connectors include contact pads 110, electrical traces 112 extending from the contact pads 110, and through-hole vias 114 electrically interconnecting conductance patterns of the different conductive layers 108 of substrate 100. The conductance pattern shown in FIG. 2 is by way of example only and may vary in further embodiments. The conductance patterns in one or more of the conductive layers 108 may be formed before the layer is assembled into the substrate 100. The conductance patterns in the various layers 108 may be formed by photolithography, screen printing and other methods.

The contact pads 110 include contact pads 110a for wire bonding semiconductor dies to the substrate as explained below. Contact pads 110 further include contact pads 110b for EMI/RFI shielding of the semiconductor device 150 as explained below. The contact pads 110b, also referred to herein as peripheral contact pads 110b, are formed in one or more peripheral edges of each substrate 100 on panel 102. That is, the peripheral pads 110b are positioned on the substrate 100 such that they are severed when the semiconductor device is singulated as explained below, leaving a portion of the severed contact pads 110b at the edge of the singulated semiconductor device. The peripheral contact pads may all be connected to a grounded Vss ring 115.

Figure 4:
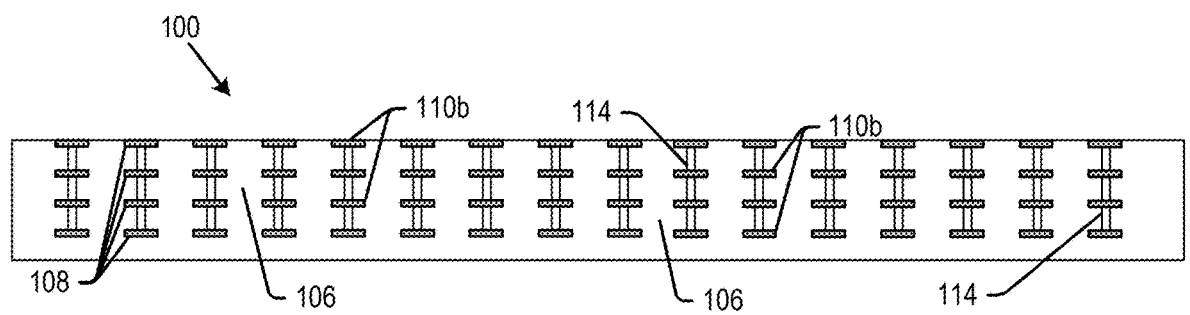
FIG. 4 is a side view of the substrate of FIG. 2.
Figure 5:
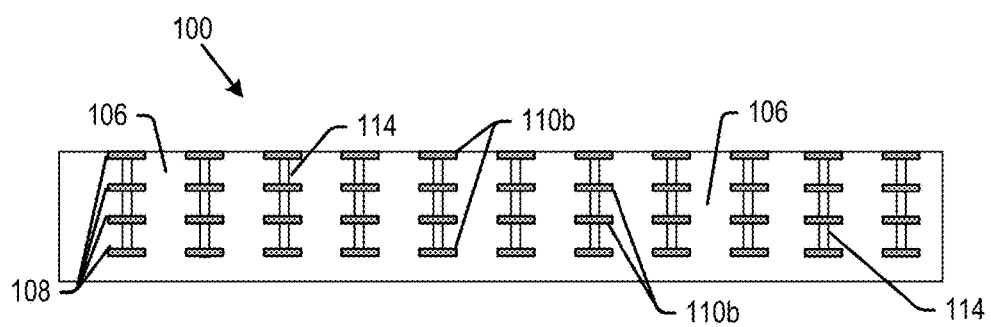
FIG. 5 is an edge view of the substrate of FIG. 2.

As noted, there may be multiple conductive layers 108. FIGS. 4 and 5 show an example including four conductive layers 108. There may be more or less conductive layers 108 in further embodiments. The four layers are each configured with peripheral contact pads 110b at the periphery of the substrate 100. A set of the peripheral contact pads 110b in respective layers 108 may be electrically coupled to each other by vias 114. Thus, each of the peripheral contact pads 110b may be grounded to a single Vss ring 115. However, there may be more than one Vss ring 115 in the various layers 108.

In embodiments, different sets of peripheral contact pads 110b from each conductive layer 108 are vertically aligned with each other as shown. However, the peripheral contact pads 110b of different layers 108 need not be aligned with each other in further embodiments. In the example shown, the peripheral contact pads 110b aligned with each other on different layers may be electrically coupled to each other using vias 114. In further embodiments the vias 114 may be omitted and the aligned peripheral contact pads 110 of different layers need not be directly electrically coupled.

FIG. 2 shows contact pads 110b around four edges of the substrate 100, but contact pads 110b may be provided along one edge, two opposed or adjacent edges or three edges in further embodiments. The number of contact pads 110a and 110b is by way of example, and may vary in further embodiments. The contact pads 110a and 110b, and the electrical connectors in general, may be formed of a variety of materials such as copper, copper alloys, plated copper alloys, Alloy 42 (42Fe/58Ni), or other metals and materials.

Referring again to FIG. 1, the substrate 100 may next be inspected in step 208, for example in an automatic optical inspection (AOI). Once inspected, the contact pads 110 may be plated in step 212, for example, with a Ni/Au, Alloy 42, or the like, in a known electroplating or thin film deposition process. The substrate 100 may next undergo operational testing in step 216 to ensure the substrate 100 is working properly. In step 220, the substrate may be visually inspected, including for example an automated visual inspection (AVI) and a final visual inspection (FVI) to check for contamination, scratches and discoloration. One or more of these steps may be omitted or performed in a different order in further embodiments.

Assuming the substrate 100 passes inspection, passive components 116 (FIG. 2) may next be affixed to the substrate 100 in a step 224. The one or more passive components may include for example one or more capacitors, resistors and/or inductors, though other components are contemplated. The passive components 116 shown are by way of example only, and the number, type and position may vary in further embodiments.

Figure 6:
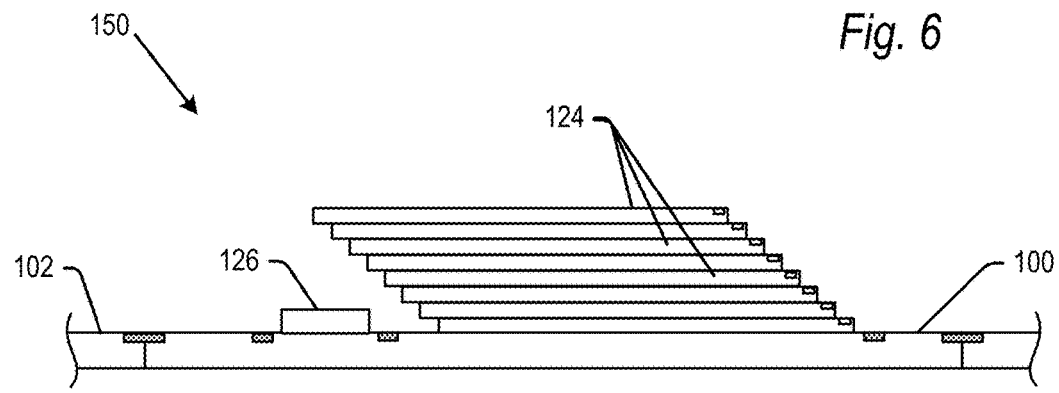
FIG. 6 is a side view of a number of semiconductor dies mounted on a substrate according to embodiments of the present technology.

In step 230, one or more semiconductor dies 120 may be mounted on the substrate 100, as shown in the edge view of FIG. 6. The semiconductor dies 120 may for example be memory dies such as 2D NAND flash memory or 3D BiCS (Bit Cost Scaling), V-NAND or other 3D flash memory, but other types of dies 120 may be used. These other types of semiconductor dies include but are not limited to RAM such as an SDRAM, DDR SDRAM, LPDDR and GDDR.

Where multiple semiconductor dies 120 are included, the semiconductor dies 120 may be stacked atop each other in an offset stepped configuration to form a die stack as shown for example in FIG. 6. The number of dies 120 shown in the stack is by way of example only, and embodiments may include different numbers of semiconductor dies, including for example 1, 2, 4, 8, 16, 32 or 64 dies. There may be other numbers of dies in further embodiments and the stacking does not have to be in the offset arrangement shown. The dies may be affixed to the substrate and/or each other using a die attach film. As one example, the die attach film may be cured to a B-stage to preliminarily affix the dies 120 in the stack, and subsequently cured to a final C-stage to permanently affix the dies 120 to the substrate 100. FIG. 6 also shows a controller die 126 mounted to the substrate 100. Controller die 126 may for example be an ASIC for controlling transfer of signals and data to and from the memory dies 120.

Figure 7:
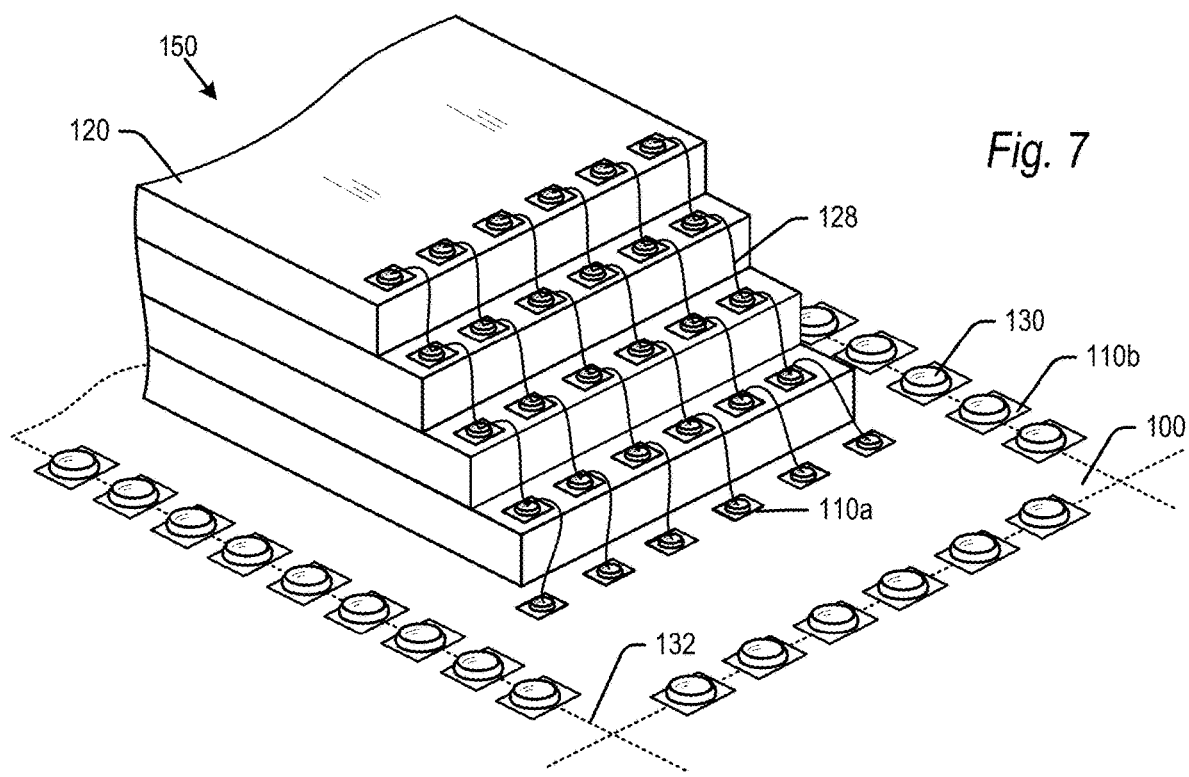
FIG. 7 is a perspective view of a number of semiconductor dies mounted on, and wire bonded to, a substrate, and further including conductive bumps around the substrate periphery according to embodiments of the present technology.

In step 234, the semiconductor dies 120 may be electrically interconnected to each other and to contact pads 110*a* on the substrate 100. Controller die 124 may also be wire bonded or flip-chip bonded to the contact pads 110*a* on the substrate in step 234. FIG. 7 shows a perspective view of bond wires 128 being formed between corresponding die bond pads on respective dies 120 down the stack, and then bonded to contact pads 110*a* on the upper surface of the substrate 100. The wire bonds may be formed using known techniques and currently available wire bonding machines, such as by a ball-bonding technique, whereby a wire bond capillary (not shown) applies a ball bump onto a contact pad 110*a*, and thereafter pays out wire to make a stitch bond at the next die bond pad. Other wire bonding techniques are possible. The semiconductor dies 120 may be electrically interconnected to each other and the substrate 100 by other methods in further embodiments, including by through-silicon vias (TSVs) and flip-chip technologies.

As noted, the semiconductor dies 120 can be memory dies, which are susceptible to external EM radiation. The semiconductor die 124 can be a controller die, which induces EM radiation. Other high frequency, EMI inducing elements may also be included with the semiconductor device 150. As such, in accordance with aspects of the present technology, the semiconductor device 150 may include components to shield the transmission and reception of EMI and/or RFI radiation. These components include conductive bumps 130 formed on peripheral contact pads 110*b* in step 236. The conductive bumps 130, also referred to herein as contact resistance, or CRES, bumps 130 may be applied in the same manner as application of the ball bumps for the wire bonds 128 in step 234. The CRES bumps 130 may be formed before the wire bonding step 234 in further embodiments.

As noted in the background section, an oxidation layer may form on the exposed surfaces of the peripheral contact pads 110*b*. In order to apply the CRES bumps 130 directly to the surface of the contact pads 110*b*, an ultrasonic welding process may be performed where the wire bond capillary oscillates at a high frequency (e.g., 20 KHz to 40 KHz) while in frictional contact with the surface of a peripheral contact pad. This oscillating frictional contact removes any oxidation layer on the peripheral contact pads 110*b* in the area where the CRES bump is applied to the peripheral contact pad. By removing the oxidation layer, the capillary may deposit a discrete amount of conductive material directly onto a surface of a contact pad 110*b* to form a CRES bump 130. Once formed, the capillary may pull away without paying out wire to leave the CRES bump on the peripheral contact pad 110*b*.

It is a feature of the present technology that the CRES bumps 130 may be formed during the same process as currently used to attach the bond wires 128 to the respective dies and substrate contact pads. Thus, the present technology may be implemented without adding new process steps. However, the CRES bumps 130 may be applied by other methods and at other times during the assembly of semiconductor device 150 in further embodiments. The oxidation layers on the surfaces of the contact pads 110*b* may be removed by other methods in further embodiments, including for example by chemical etching.

The CRES bumps 130 are formed of a conductive, low-oxidizing material, such as for example Gold. The CRES bumps 130 may be formed of other conductive, low-oxidizing materials in further embodiments, including for example Nickel or Silver, or alloys including Gold, Nickel and/or Silver.

FIG. 7 shows the peripheral contact pads 110*b* and CRES bumps 130 formed on a substrate outline 132, defining the eventual footprint of the semiconductor device 150 once singulated from panel 102 as explained below. As shown, the CRES bumps 130 straddle the outline 132 so that, once the semiconductor device 150 is singulated, the CRES bumps 130 are severed, leaving a portion of each CRES bump 130 exposed at an edge of substrate 100. The size of the CRES bumps 130 relative to the ball bumps formed on contact pads 110*a* is shown for illustrative purposes only, and the CRES bumps 130 may be the same size, larger than or smaller than the ball bumps formed on contact pads 110*a*. In embodiments, the CRES bumps 130 may be circular, with a diameter of 30μ to 70μ However, the CRES bumps 130 may be other shapes and other sizes in further embodiments.

Following formations of CRES bumps 130 and electrical connection of the dies 120 to the substrate 100, the semiconductor device 150 may be housed within an enclosure in a step 238. The enclosure may be a mold compound 136 encapsulating the semiconductor dies, bond wires 128 and other components on substrate 100. The mold compound 136 may include for example solid epoxy resin, Phenol resin, fused silica, crystalline silica, carbon black and/or metal hydroxide. Other mold compounds from other manufacturers are contemplated. The mold compound may be applied by various known processes, including by compression molding, transfer molding or injection molding techniques. The semiconductor devices 150 may be encapsulated by other methods including FFT (flow free thin) molding.

Figure 8:
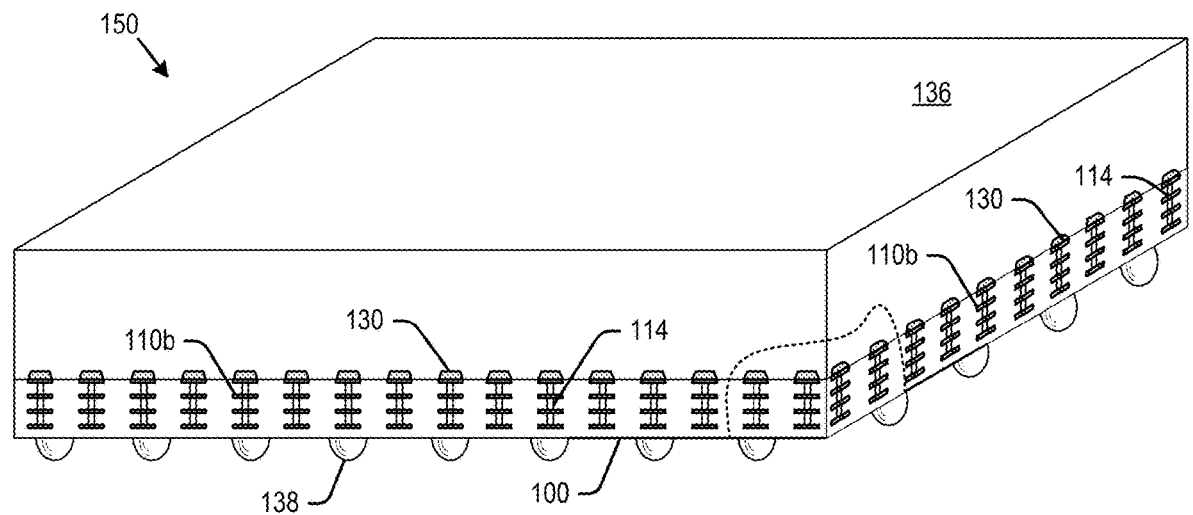
FIG. 8 is a perspective view of an encapsulated semiconductor device according to embodiments of the present technology.

At this stage in the assembly, the individual semiconductor devices 150 are still part of panel 102 so the mold compound is applied over the entire surface of the panel 102. Once the mold compound is applied, the individual semiconductor devices 150 may be singulated from the panel 102 in step 240 and as shown in FIG. 8. The individual semiconductor devices may be singulated from panel 102 using any of a variety of cutting methods including by saw blade, laser, waterjet or other methods.

Figure 9:
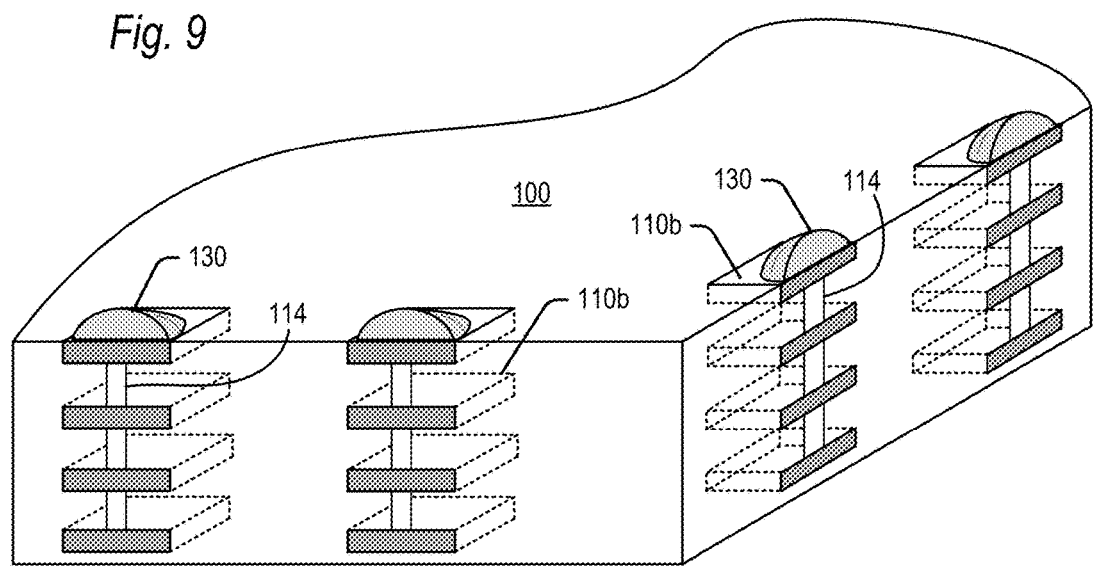
FIG. 9 is an enlarged view of a section of the semiconductor device shown in FIG. 8.

FIG. 9 is an enlarged sectional view of a corner of substrate 100 indicated by dashed lines in FIG. 8. The mold compound 136 is omitted from FIG. 9 for clarity. As shown in FIGS. 8 and 9, upon singulation, edges of the peripheral contact pads 110*b* in the one or more layers 108 of substrate 100 have been severed and are exposed at one or more edges of the semiconductor device 150. Moreover, portions of the CRES bumps 130 are also severed and exposed at one or more edges of the semiconductor device 150. As used herein, the term "severed" means to have been cut, but not cut away, so that the severed edges remain after being cut. The individual semiconductor devices 150 may be square or rectangular, but may be other shapes in further embodiments, with the provision that portions of the CRES bumps 130 be exposed at one or more edges of the device 150.

In embodiments, the completed semiconductor device 150 may be used as a BGA (ball grid array) package, affixed to a host device such as a printed circuit board. For such embodiments, solder balls 138 may be formed on a lower surface of the substrate 100 for use in soldering the semiconductor device 150 to the host device. Solder balls 138 may be formed on the substrate 100 at an earlier stage in the assembly of the semiconductor device 150 or formed after the singulation step 244, for example with a sputtered conductive coating. In further embodiments, the semiconductor device 150 may be used as a removable LGA (land grid array) package. In such embodiments, the solder balls 138 may be omitted.

Figure 10:
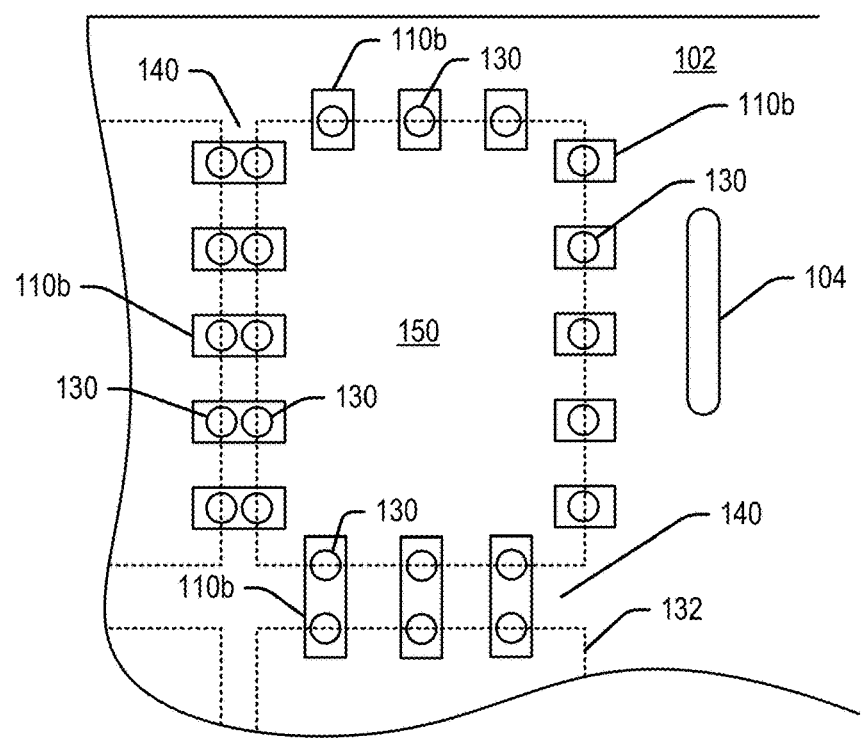
FIG. 10 is a top view of a section of a substrate panel showing a first configuration of peripheral contact pads and conductive bumps.
Figure 11:
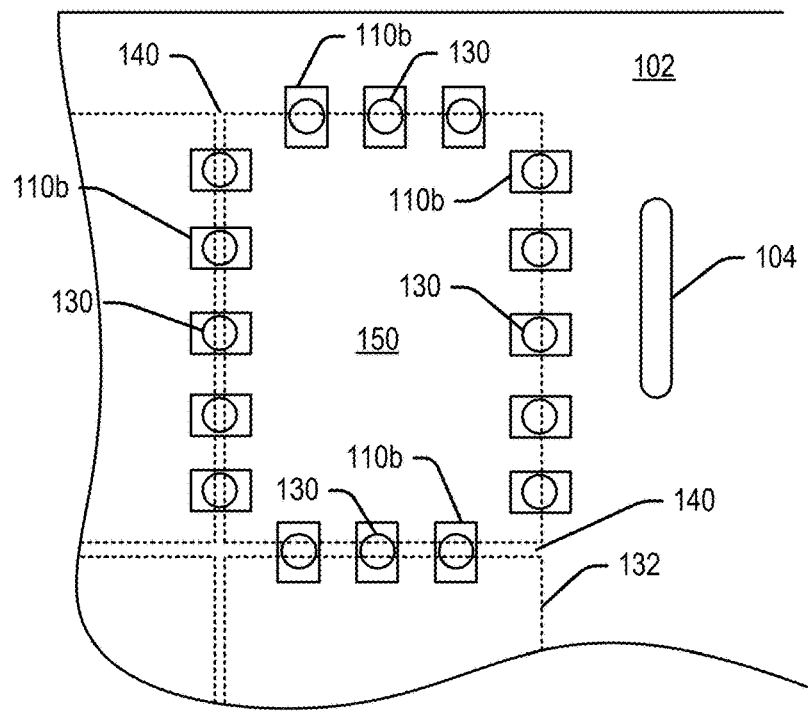
FIG. 11 is a top view of a section of a substrate panel showing a second configuration of peripheral contact pads and conductive bumps.

FIGS. 10 and 11 are top views of portions of two different panels 102 showing a full semiconductor device 150 surrounded by portions of adjacent semiconductor devices 150. The semiconductor device outlines 132 are shown with dashed lines. Panels 102 may typically include a kerf 140 between adjacent semiconductor packages 150. The kerf 140 spaces apart adjacent semiconductor devices 150, for example to leave room for a saw blade or other cutting mechanism during the singulation step 240. In FIG. 10, the kerf width is relatively large, e.g., larger than a diameter of a CRES bump 130. In such embodiments, a single peripheral contact pad 110b may extend across the kerf 140 between two adjacent semiconductor devices 150 as shown. In further embodiments, the single peripheral contact pad 110b may instead be separated into two discrete peripheral contact pads 110b, one in both of the adjacent semiconductor devices, extending partially into kerf 140. Given the relatively large kerf width, the peripheral contact pads 110b shown may each include two CRES bumps 130, one straddling the outline 132 of a first semiconductor device 150, and the second straddling the outline 132 of a next adjacent semiconductor device 150.

The full semiconductor device 150 shown in FIG. 10 is in the top row of the panel 102. As such, the peripheral contact pads 110b along the upper edge of the full semiconductor device 150 have only a single CRES bump 130. Similarly, the full semiconductor device 150 shown in FIG. 10 is adjacent to the central fiducial marks 104. As such, the peripheral contact pads 110b along the right edge of the full semiconductor device 150 have only a single CRES bump 130.

In FIG. 11, the kerf width is non-existent or relatively small, e.g., smaller than a diameter of a CRES bump 130. In such embodiments, a single peripheral contact pad 110b may extend across the kerf 140 between two adjacent semiconductor devices 150 as shown and described above. Similarly, the peripheral contact pads 110b shown may each include a single CRES bump 130, straddling the outline 132 of two adjacent semiconductor devices 150. When the devices 150 are singulated from panel 102 as described above, a first portion of a single CRES bump 130 remains at the edge of a first device, and a second portion of the single CRES bump 130 remains at the edge of the next adjacent device 150.

Figure 12:
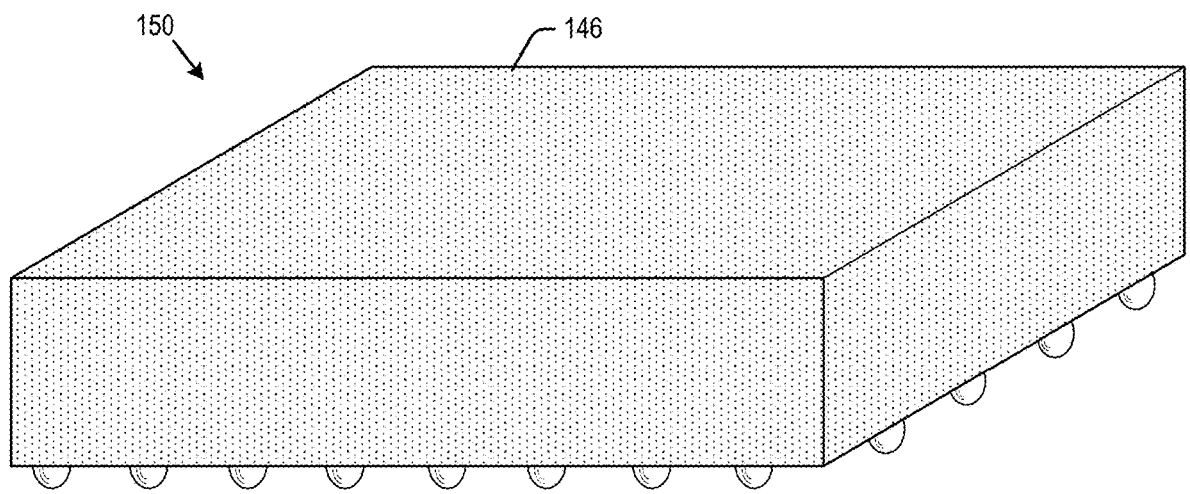
FIG. 12 is a perspective view of completed semiconductor device according to embodiments of the present technology.

After the individual devices 150 are singulated from the panel 102, the individual devices 150 may receive an EMI/RFI protective coating 146 in step 244 as shown in FIG. 12. The coating 146 may be a thin layer of an electrical conductor such as copper, applied by sputtering, plating or thin film deposition techniques. The coating 146 may be applied over the top surface, and side and edge surfaces of the semiconductor device 150, including over the exposed sides and edges of the substrate 100. The coating 146 electrically couples to the exposed edge portions of the CRES bumps 130, as well as the exposed edge portions of the peripheral contact pads 110b.

As noted in the Background section, there is an oxidation layer between the coating 146 and the exposed edge portions of the contact pads 110b, which increases CRES and lowers the effectiveness of the coating 146 to shield the device 150 against the transmission and reception of EMI and/or RFI radiation. However, no such oxidation layer exists between the exposed edge portions of the CRES bumps 130 and the coating 146. Thus, the coating 146 is grounded through the CRES bumps 130 and substrate with a low contact resistance to provide a highly effective shield in the device 150 against the transmission and reception of EMI and/or RFI radiation.

Figure 13:
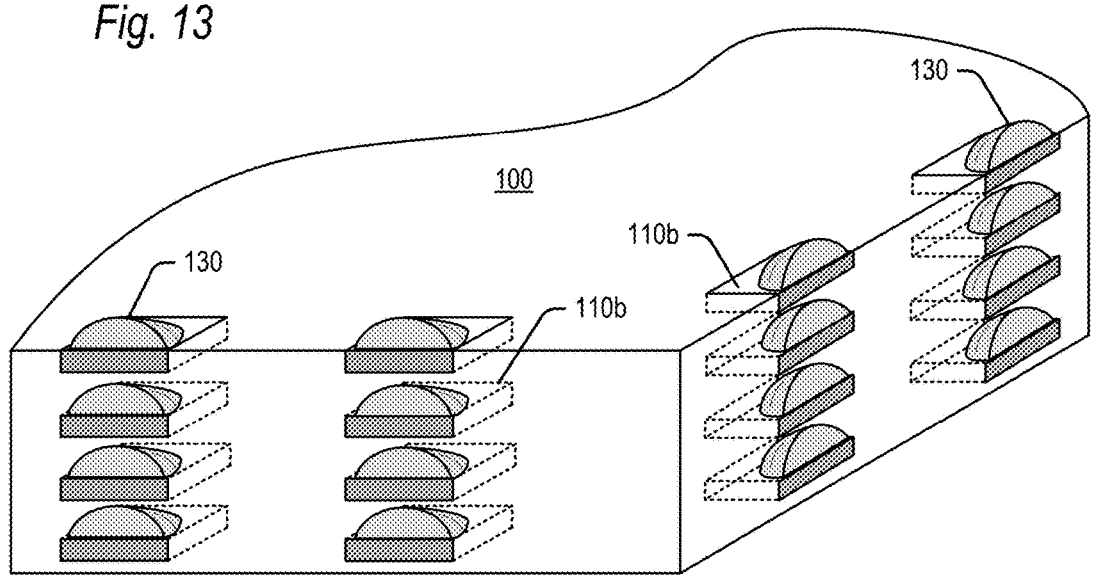
FIG. 13 is an enlarged view of a section of the semiconductor device according to an alternative embodiment of the present technology.

In embodiments described above, the CRES bumps 130 on different layers 108 in the substrate 100 may be directly electrically coupled to each other using vias 114. In further embodiments the vias 114 may be omitted and the aligned peripheral contact pads 110 of different layers need not be directly electrically coupled. Such an embodiment is shown in FIG. 13. In this embodiment, a CRES bump 130 may be provided on each contact pad in a set of vertically aligned contact pads 110b. In such embodiments, each layer 108 may include its own grounded Vss ring 115 (FIG. 2). Alternatively, the CRES bumps 130 may be indirectly electrically coupled by vias 114 elsewhere in the layers 108 (not shown).

In summary, in one example, the present technology relates to a semiconductor device, comprising: a substrate comprising: one or more conductive layers, a layer of the one or more conductive layers comprising peripheral contact pads around one or more edges of the substrate, and conductive bumps formed on the peripheral contact pads and comprising severed edges at the one or more edges of the substrate; one or more semiconductor dies mounted on the substrate and electrically coupled to the substrate; an enclosure housing the one or more semiconductor dies; and an electrically conductive coating on the enclosure configured to shield the semiconductor device against the transmission and/or reception of at least one of electromagnetic interference and radio frequency interference, the electrically conductive coating electrically coupled to the severed edges of the conductive bumps.

In another example, the present technology relates to a semiconductor device, comprising: a substrate comprising: a plurality of conductive layers, the plurality of conductive layers each comprising electrically grounded peripheral contact pads around one or more edges of the substrate, and conductive bumps, formed of a non-oxidizing material, on the peripheral contact pads of one or more of the conductive layers, the conductive bumps comprising severed edges at the one or more edges of the substrate; one or more semiconductor dies mounted on the substrate and electrically coupled to the substrate; an enclosure housing the one or more semiconductor dies; and an electrically conductive coating on the enclosure configured to shield the semiconductor device against the transmission and/or reception of at least one of electromagnetic interference and radio frequency interference, the electrically conductive coating electrically coupled to the severed edges of the conductive bumps.

In a further example, the present technology relates to a semiconductor device, comprising: a substrate comprising: one or more conductive layers, a layer of the one or more conductive layers comprising peripheral contact pads around one or more edges of the substrate, and conductive, non-oxidizing means on the peripheral contact pads for conducting an electrical charge to ground; one or more semiconductor dies mounted on the substrate and electrically coupled to the substrate; an enclosure housing the one or more semiconductor dies; and an electrically conductive coating on the enclosure configured to shield the semiconductor device against the transmission and/or reception of at least one of electromagnetic interference and radio frequency interference, the electrically conductive coating electrically coupled to the conductive, non-oxidizing means.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a substrate comprising:
      one or more conductive layers, a layer of the one or more conductive layers comprising peripheral contact pads around one or more edges of the substrate, and
      conductive bumps formed on the peripheral contact pads and comprising severed edges at the one or more edges of the substrate;
   one or more semiconductor dies mounted on the substrate and electrically coupled to the substrate;
   an enclosure housing the one or more semiconductor dies; and
   an electrically conductive coating disposed on the enclosure configured to shield the semiconductor device against the transmission and/or reception of at least one of electromagnetic interference and radio frequency interference, the electrically conductive coating electrically coupled to the severed edges of the conductive bumps;
   wherein the conductive bumps are severed during singulation of the semiconductor device from a panel.

2. The semiconductor device of claim 1, wherein the conductive bumps are formed of a conductive material preventing formation of an oxidation layer between the severed edges of the conductive bumps and the electrically conductive housing.

3. The semiconductor device of claim 1, wherein the conductive bumps are formed of gold.

4. The semiconductor device of claim 1, wherein the conductive bumps are electrically coupled to a grounded ring formed in the substrate.

5. The semiconductor device of claim 1, wherein the conductive bumps are formed around four edges of the substrate.

6. The semiconductor device of claim 1, wherein the electrically conductive coating is formed of copper.

7. The semiconductor device of claim 1, wherein the one or more conductive layers comprise a plurality of conductive layers, and wherein the plurality of conductive layers each comprise peripheral contact pads around one or more edges of the substrate.

8. The semiconductor device of claim 7, wherein the peripheral contact pads in respective layers of the plurality of layers are vertically aligned with each other at the one or more edges of the substrate.

9. The semiconductor device of claim 8, wherein a set of vertically aligned peripheral contact pads in the plurality of layers are electrically coupled to each other by a via extending through the set of vertically aligned contact pads.

10. The semiconductor device of claim 9, wherein a single one of the peripheral contact pads in the set of vertically aligned peripheral contact pads comprises a conductive bump of the conductive bumps.

11. The semiconductor device of claim 9, wherein each of the peripheral contact pads in the set of vertically aligned peripheral contact pads comprise a conductive bump of the conductive bumps.

12. A semiconductor device, comprising:
   a substrate comprising:
      a plurality of stacked conductive layers, the plurality of conductive layers each comprising electrically grounded peripheral contact pads around one or more edges of the substrate, and
      conductive bumps, formed of a non-oxidizing material, on the peripheral contact pads of one or more of the conductive layers, the conductive bumps comprising severed edges at the one or more edges of the substrate;
   one or more semiconductor dies mounted on the substrate and electrically coupled to the substrate;
   an enclosure housing the one or more semiconductor dies; and
   an electrically conductive coating disposed on the enclosure configured to shield the semiconductor device against the transmission and/or reception of at least one of electromagnetic interference and radio frequency interference, the electrically conductive coating electrically coupled to the severed edges of the conductive bumps.

13. The semiconductor device of claim 12, wherein the conductive bumps are formed of gold.

14. The semiconductor device of claim 12, wherein the electrically conductive coating is formed over a first major surface of the semiconductor device, opposed to a second major surface comprising the substrate, side surfaces extending between the first and second major surfaces and edge surfaces extending between the first and second major surfaces.

15. The semiconductor device of claim 14, wherein the conductive bumps are formed around one or more side surfaces and one or more edge surfaces.

16. The semiconductor device of claim 12, wherein the conductive bumps are formed on each of the plurality of conductive layers, and wherein a set of the peripheral contact pads in respective layers of the plurality of layers are vertically aligned with each other.

17. The semiconductor device of claim 16, wherein a single peripheral contact pad in the set of peripheral contact pads comprises a conductive bump of the conductive bumps.

18. The semiconductor device of claim 16, wherein each peripheral contact pad in the set of peripheral contact pads comprise a conductive bump of the conductive bumps.

* * * * *